United States Patent
Hayase

(10) Patent No.: US 10,811,337 B2
(45) Date of Patent: Oct. 20, 2020

(54) SEMICONDUCTOR DEVICE AND POWER CONVERTOR

(71) Applicants: Kabushiki Kaisha Toshiba, Minato-ku, Tokyo (JP); Toshiba Electronic Devices & Storage Corporation, Minato-ku, Tokyo (JP)

(72) Inventor: Shigeaki Hayase, Kanazawa Ishikawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/258,804

(22) Filed: Jan. 28, 2019

(65) Prior Publication Data
US 2020/0058574 A1   Feb. 20, 2020

(30) Foreign Application Priority Data
Aug. 15, 2018 (JP) .................. 2018-152951

(51) Int. Cl.
| | | |
|---|---|---|
| *H01L 23/00* | (2006.01) | |
| *H01L 23/473* | (2006.01) | |
| *H01L 25/07* | (2006.01) | |
| *H02M 1/00* | (2006.01) | |
| *H01L 23/34* | (2006.01) | |
| *H01L 23/46* | (2006.01) | |
| *H01L 23/467* | (2006.01) | |

(52) U.S. Cl.
CPC ........ *H01L 23/473* (2013.01); *H01L 25/074* (2013.01); *H01L 23/34* (2013.01); *H01L 23/345* (2013.01); *H01L 23/46* (2013.01); *H01L 23/467* (2013.01); *H02M 1/00* (2013.01)

(58) Field of Classification Search
CPC ..... H01L 23/46; H01L 23/467; H01L 23/473; H01L 23/34; H01L 23/345
See application file for complete search history.

(56) References Cited

U.S. PATENT DOCUMENTS

| | | | | |
|---|---|---|---|---|
| 8,129,225 | B2 * | 3/2012 | Landau | H01L 24/97 |
| | | | | 438/123 |
| 8,278,747 | B2 * | 10/2012 | Mamitsu | H01L 21/565 |
| | | | | 257/678 |
| 9,070,666 | B2 * | 6/2015 | Mamitsu | H01L 23/4334 |
| 9,125,322 | B2 * | 9/2015 | Stella | H01L 23/367 |
| 9,202,766 | B2 * | 12/2015 | Stella | H01L 23/4334 |
| 9,502,327 | B2 * | 11/2016 | Sugiura | B23K 1/0016 |
| 9,960,096 | B2 * | 5/2018 | Okumura | H01L 25/07 |
| 10,049,952 | B2 * | 8/2018 | Kadoguchi | H01L 21/31058 |
| 10,079,226 | B2 * | 9/2018 | Mamitsu | H01L 23/40 |
| 2005/0030717 | A1 | 2/2005 | Inagaki et al. | |

FOREIGN PATENT DOCUMENTS

| | | |
|---|---|---|
| JP | 4023416 B2 | 12/2007 |
| JP | 2012-178513 A | 9/2012 |
| JP | 2013-066259 A | 4/2013 |

* cited by examiner

*Primary Examiner* — Nicholas J Tobergte
(74) *Attorney, Agent, or Firm* — White & Case LLP

(57) ABSTRACT

A semiconductor device includes a first electrode plate, a second electrode plate disposed to oppose the first electrode plate, and a semiconductor chip disposed between the first electrode plate and the second electrode plate. At least one of the first electrode plate and the second electrode plate has a space where a cooling medium circulates.

14 Claims, 5 Drawing Sheets

… (1)

SEMICONDUCTOR DEVICE AND POWER CONVERTOR

CROSS-REFERENCE TO RELATED APPLICATIONS

This application is based upon and claims the benefit of priority from Japanese Patent Application No. 2018-152951, filed on Aug. 15, 2018; the entire contents of which are incorporated herein by reference.

FIELD

Embodiments relate to a semiconductor device and a power convertor.

BACKGROUND

Inverters and converters used for the power conversion under high voltage and large current are configured by connecting multiple semiconductor devices in series, in which the semiconductor devices each include switching elements such as IGBTs (Insulated Gate Bipolar Transistors), MOS transistors, etc., and are stacked. In such a power converter, it is preferable to efficiently cool the switching elements by disposing a cooler part between the multiple semiconductor devices.

DETAILED DESCRIPTION

Figure 1:
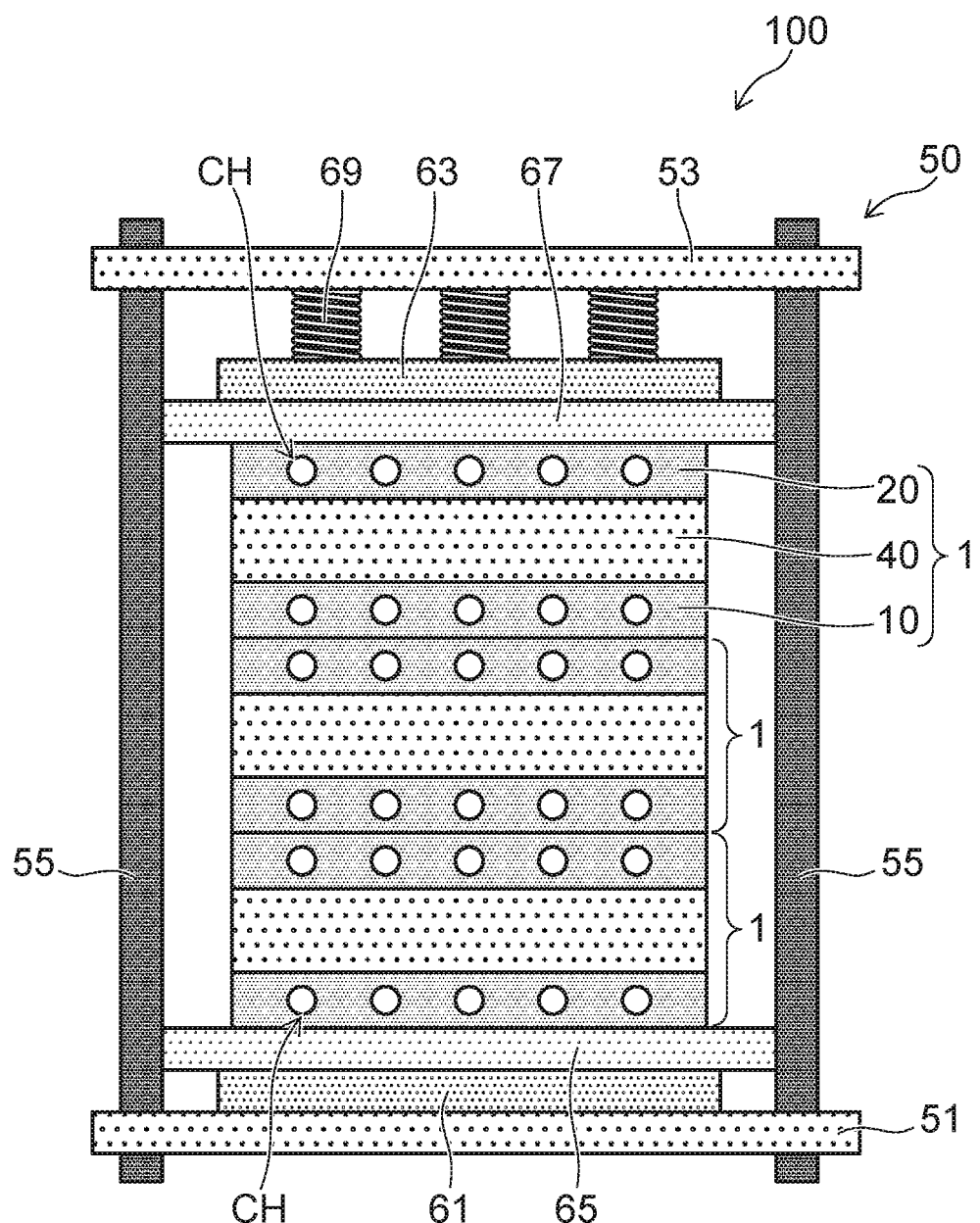
FIG. 1 is a schematic view showing a power converter according to an embodiment.
Figure 1:
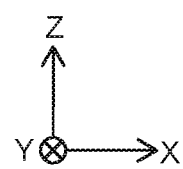

According to one embodiment. A semiconductor device includes a first electrode plate, a second electrode plate disposed to oppose the first electrode plate, and a semiconductor chip disposed between the first electrode plate and the second electrode plate. At least one of the first electrode plate and the second electrode plate has a space where a cooling medium circulates.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic view showing a power converter 100 according to an embodiment. The power converter 100 is, for example, an inverter or a converter and has a structure in which a number of semiconductor devices 1 are connected in series to obtain a prescribed breakdown voltage.

As shown in FIG. 1, the power converter 100 includes the multiple semiconductor devices 1 and a frame body 50. The semiconductor device 1 includes a first electrode plate 10, a second electrode plate 20, a semiconductor chip 30 (referring to FIG. 2A), and a case 40. The first electrode plate 10 and the second electrode plate 20 have cooling spaces CH for circulating a cooling medium.

The frame body 50 includes support plates 51 and 53 and a post 55. The post 55 extends in the Z-direction and is disposed to support the support plates 51 and 53 disposed to be separated in the Z-direction. The multiple semiconductor devices 1 are stacked in the Z-direction between the support plates 51 and 53.

As shown in FIG. 1, the power converter 100 further includes a pedestal 61, a pressing plate 63, insulating members 65 and 67, and an elastic member 69. The multiple semiconductor devices 1 are disposed between the pedestal 61 and the pressing plate 63. The insulating member 65 is disposed between the pedestal 61 and the lowermost semiconductor device 1 of the multiple semiconductor devices 1. The insulating member 67 is disposed between the pressing plate 63 and the uppermost semiconductor device 1 of the multiple semiconductor devices 1.

The power converter 100 is configured so that a prescribed pressure is applied to the pressing plate 63 by the elastic member 69 additionally provided at the support plate 53; and the multiple semiconductor devices 1 that are stacked in the Z-direction are pressed in contact with each other. The elastic member 69 is, for example, a spring.

Figure 2A:
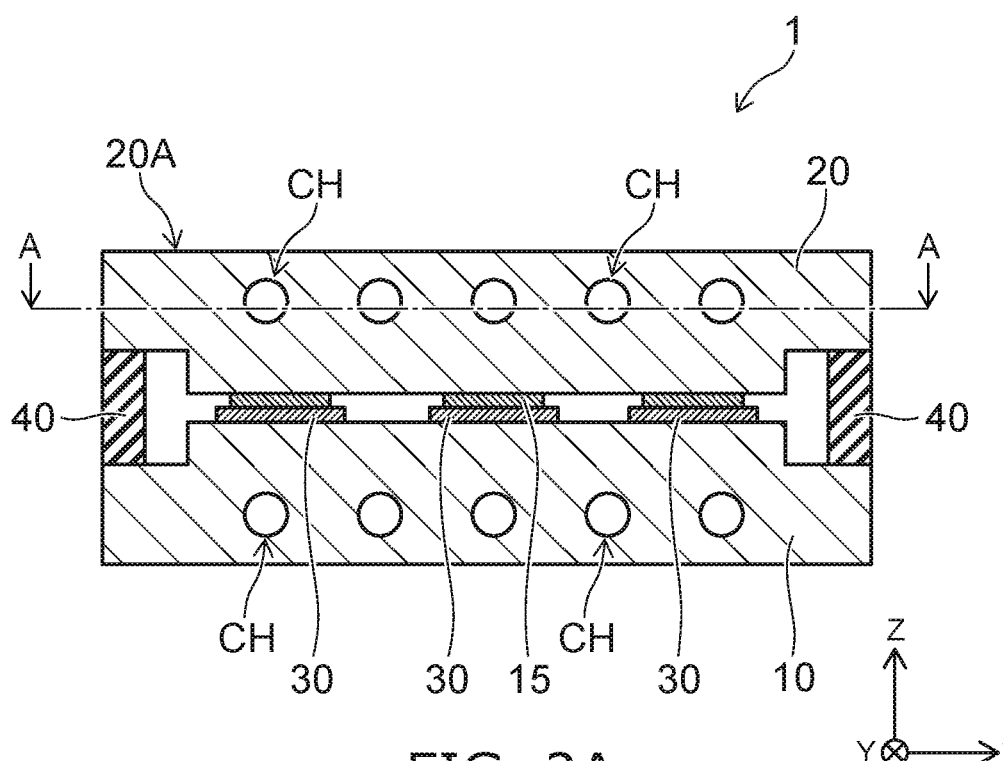
FIGS. 2A and 2B are schematic views showing the semiconductor device according to the embodiment.
Figure 2B:
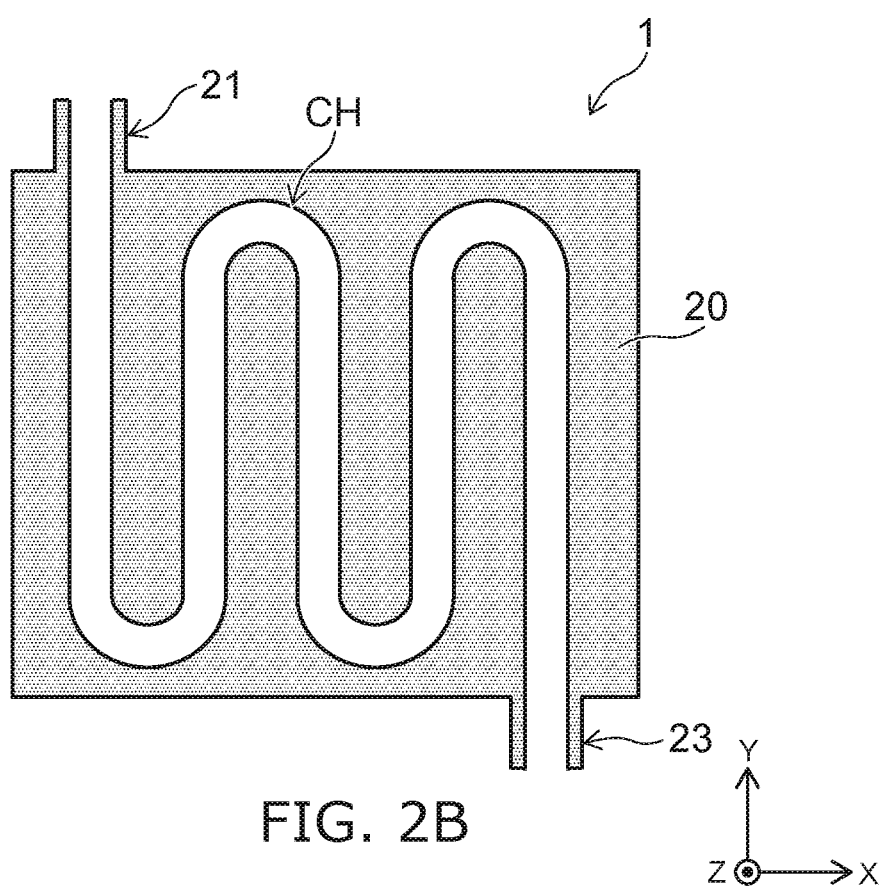

FIGS. 2A and 2B are schematic views showing the semiconductor device 1 according to the embodiment. FIG. 2A is a schematic view showing a cross section of the semiconductor device 1. FIG. 2B is a schematic view showing a cross section along line A-A shown in FIG. 2A.

As shown in FIG. 2A, the semiconductor device 1 includes the multiple semiconductor chips 30 disposed between the first electrode plate 10 and the second electrode plate 20. The semiconductor chips 30 are, for example, IGBTs, MOS transistors, or diodes. The semiconductor chips 30 are connected to the first electrode plate 10 and the second electrode plate 20 in parallel. For example, the semiconductor chips 30 are disposed to contact the first electrode plate 10.

As shown in FIG. 2A, a metal spacer 15 may be disposed between the second electrode plate 20 and the semiconductor chip 30. The metal spacer 15 is, for example, a metal plate including molybdenum. The metal spacer 15 may be disposed between the first electrode plate 10 and the semiconductor chip 30 and may be disposed at both the upper surface and the lower surface of the semiconductor chip 30.

The case 40 is disposed to seal the semiconductor chips 30 in the space between the first electrode plate 10 and the second electrode plate 20. The case 40 may include, for example, an insulative resin or ceramic.

For example, the first electrode plate 10 and the second electrode plate 20 are connected respectively to the second electrode plate 20 and the first electrode plate 10 of other semiconductor devices 1 disposed above and below (referring to FIG. 1). The semiconductor chips 30 that are included in the multiple semiconductor devices 1 stacked in the Z-direction are connected in series via the first electrode plates 10 and the second electrode plates 20. Also, for example, the first electrode plate 10 of the semiconductor device 1 disposed in the lowermost level and the second electrode plate 20 of the semiconductor device 1 disposed in the uppermost level include terminals (not illustrated) connected to an external circuit or are configured to be connectable to the external circuit at not-illustrated portions via, for example, conductors having bar configurations (bus bars).

As shown in FIG. 2B, the cooling space CH is a hollow extending along an upper surface 20A of the second electrode plate 20 (referring to FIG. 2A). The cooling space CH includes an inflow port 21 and an outflow port 23 of the cooling medium and is provided so that it is possible to cool the entire second electrode plate 20. The cooling medium is, for example, cooling water, a coolant including ethylene glycol, etc. The cooling space CH that is provided in the first electrode plate 10 also has a similar configuration.

In the power converter 100, the cooling efficiency of the semiconductor chip 30 can be increased because the cooling spaces CH are provided in the first electrode plate 10 and the second electrode plate 20 of the semiconductor device 1. Also, because it is unnecessary to dispose another cooling apparatus between the semiconductor devices 1 stacked in the Z-direction, it is possible to reduce the size in the Z-direction; and downsizing is possible. Further, by omitting the other cooling apparatus, the number of parts can be reduced; and costs can be reduced.

For example, in a pressed-contact power converter, it is favorable to reduce the electrical resistance and the thermal resistance of the contact surfaces between the parts stacked in the Z-direction by coating conductive grease between the parts. In the embodiment, by omitting the other cooling apparatus disposed between the semiconductor devices 1 adjacent to each other in the Z-direction, the coating surface of the conductive grease can be halved; and higher efficiency of the assembly operation of the power converter 100 can be realized. Also, because each of the semiconductor devices 1 includes a cooling mechanism, it is also possible to increase the tolerance for uneven coating of the conductive grease.

Figure 3A:
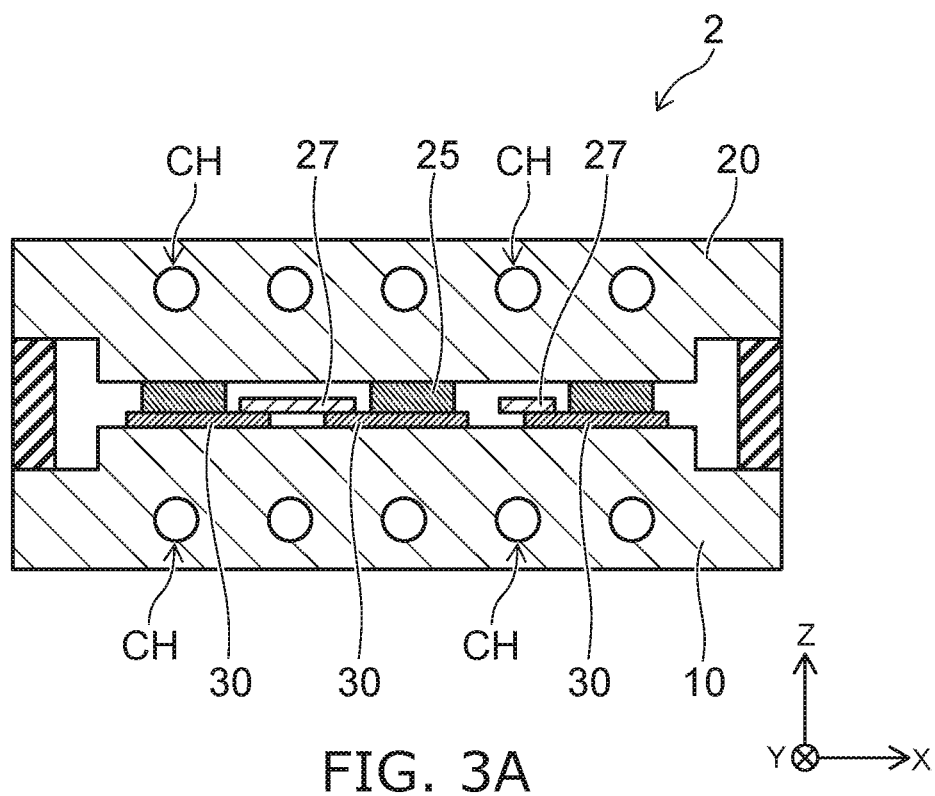
FIGS. 3A and 3B are schematic views showing another semiconductor device according to the embodiment.
Figure 3B:
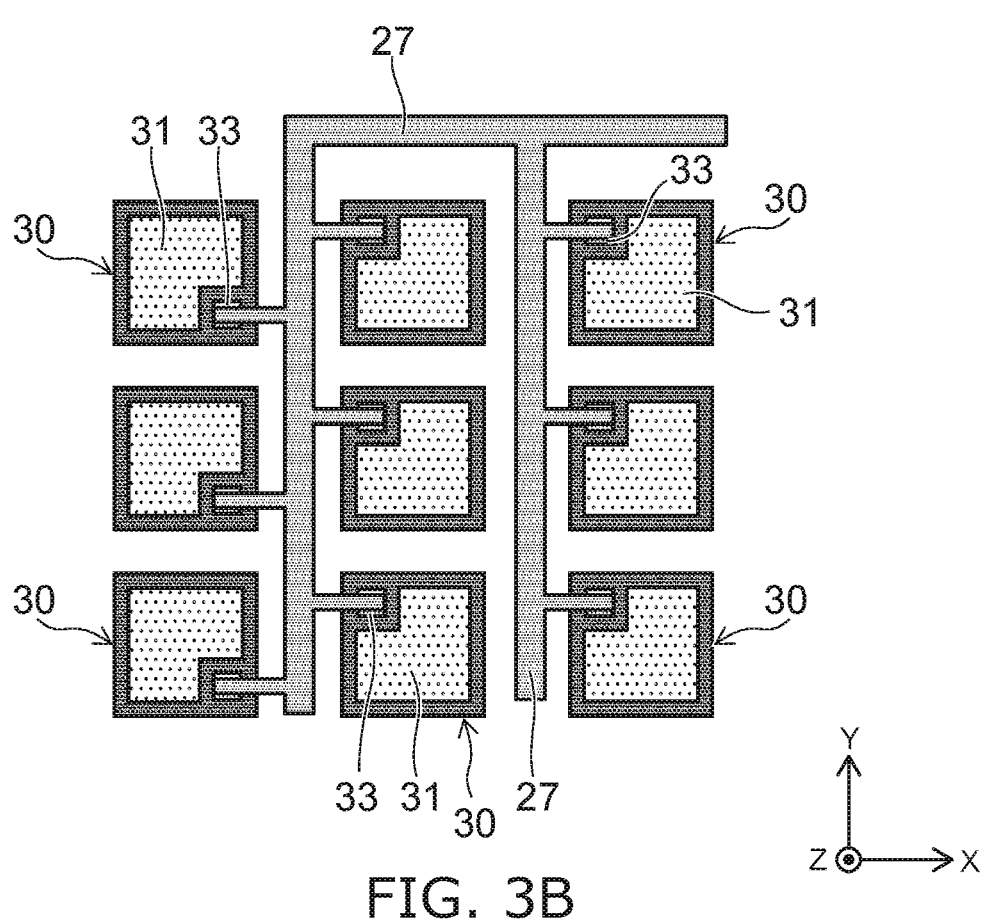

FIGS. 3A and 3B are schematic views showing another semiconductor device 2 according to the embodiment. FIG. 3A is a schematic view showing a cross section of the semiconductor device 2. FIG. 3B is a schematic view showing the arrangement of the semiconductor chips 30.

As shown in FIG. 3A, the multiple semiconductor chips 30 are disposed between the first electrode plate 10 and the second electrode plate 20. For example, the semiconductor chips 30 are disposed to contact the first electrode plate 10. The semiconductor chips 30 are, for example, IGBTs or MOS transistors. Also, the semiconductor chips 30 may be, for example, diodes.

In the example, a gate interconnect 27 is provided between the first electrode plate 10 and the second electrode plate 20. The gate interconnect 27 is connected to gate electrodes 33 of the semiconductor chips 30 (referring to FIG. 3B). A metal spacer 25 is disposed between the second electrode plate 20 and the semiconductor chips 30. The metal spacer 25 has a thickness in the Z-direction that can ensure a space such that the gate interconnect 27 can be disposed between the second electrode plate 20 and the semiconductor chips 30. Also, the metal spacer 25 electrically connects the second electrode plate 20 to an electrode of the semiconductor chip 30.

As shown in FIG. 3B, the semiconductor chip 30 includes, for example, an emitter electrode 31 (or a source electrode 31) and the gate electrode 33 on the surface opposing the second electrode plate 20. For example, the gate interconnect 27 is pressed in contact with the gate electrode 33 of each of the semiconductor chips 30 by a not-illustrated elastic member. Also, the metal spacer 25 is disposed on the emitter electrode 31.

The emitter electrode 31 of the semiconductor chip 30 is electrically connected to the second electrode plate 20 via the metal spacer 25. Also, a not-illustrated collector electrode (or a drain electrode) is provided on the surface of the semiconductor chip 30 opposing the first electrode plate 10. For example, the first electrode plate 10 is disposed to contact the collector electrode of the semiconductor chip 30.

The cooling spaces CH are provided also in the first electrode plate 10 and the second electrode plate 20 of the semiconductor device 2. Thereby, the semiconductor chips 30 can be cooled efficiently. Also, in the case where the semiconductor devices 2 are stacked in the Z-direction, it is unnecessary to dispose another cooling apparatus between the adjacent semiconductor devices 2; and the size in the Z-direction of the stacked structure can be reduced.

Figure 4:
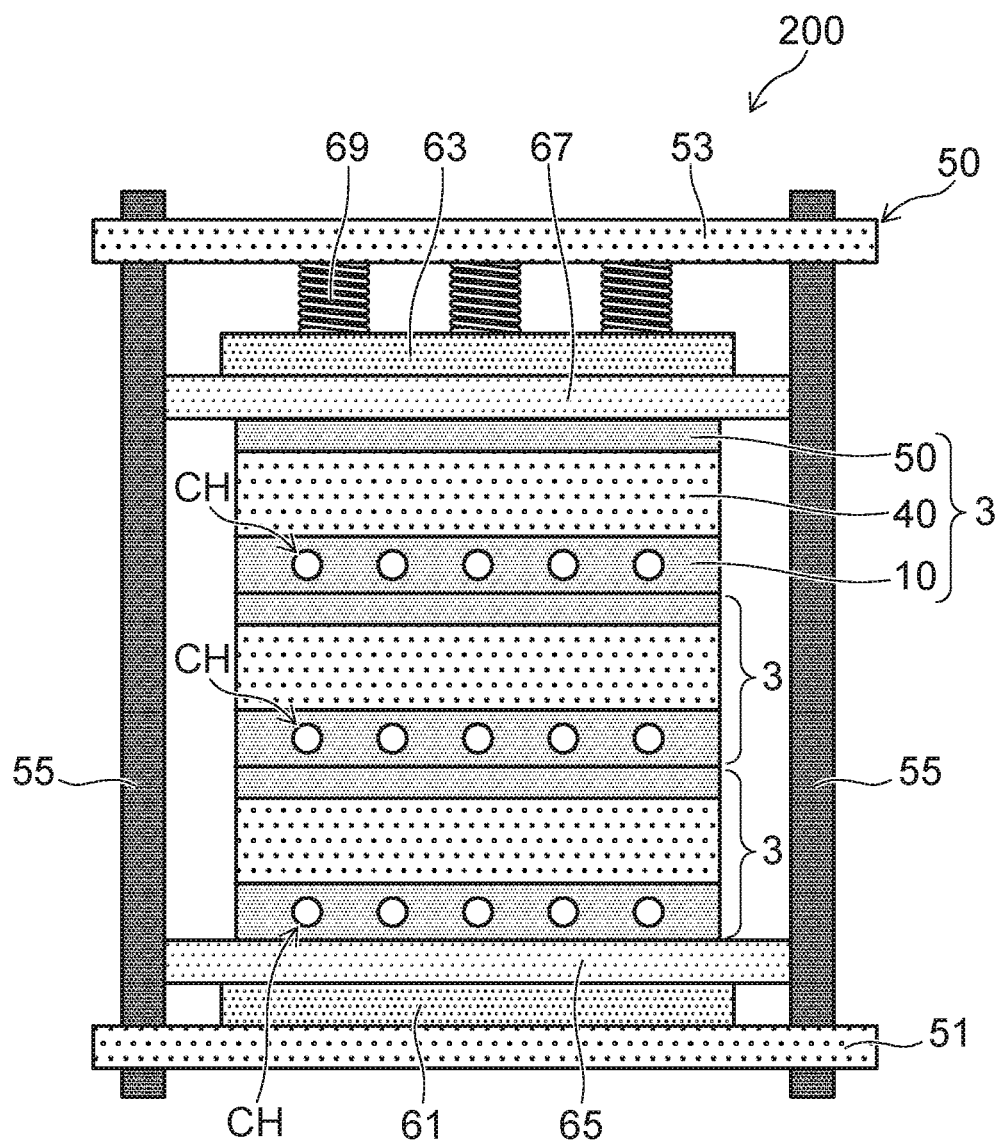
FIG. 4 is a schematic view showing a power converter according to a modification of the embodiment.

FIG. 4 is a schematic view showing a power converter 200 according to a modification of the embodiment. The power converter 200 includes multiple semiconductor devices 3 and the frame body 50.

The multiple semiconductor devices 3 are stacked in the Z-direction between the support plates 51 and 53. The multiple semiconductor devices 3 are disposed between the pedestal 61 and the pressing plate 63 with the insulating members 65 and 67 interposed and are pressed in contact with each other by the elastic member 69 additionally provided at the support plate 53.

As shown in FIG. 4, the semiconductor device 3 includes the first electrode plate 10, the second electrode plate 20, the semiconductor chips 30 (referring to FIG. 2A), and the case 40. In the example, the first electrode plate 10 has the cooling space CH for circulating the cooling medium. The cooling space CH is not provided in the second electrode plate 20. Thereby, the size in the Z-direction of the stacked body in which the multiple semiconductor devices 3 are stacked in the Z-direction can be reduced further. Also, the assembly operation of the power converter 200 can be simplified; and the manufacturing cost can be reduced.

Figure 5A:
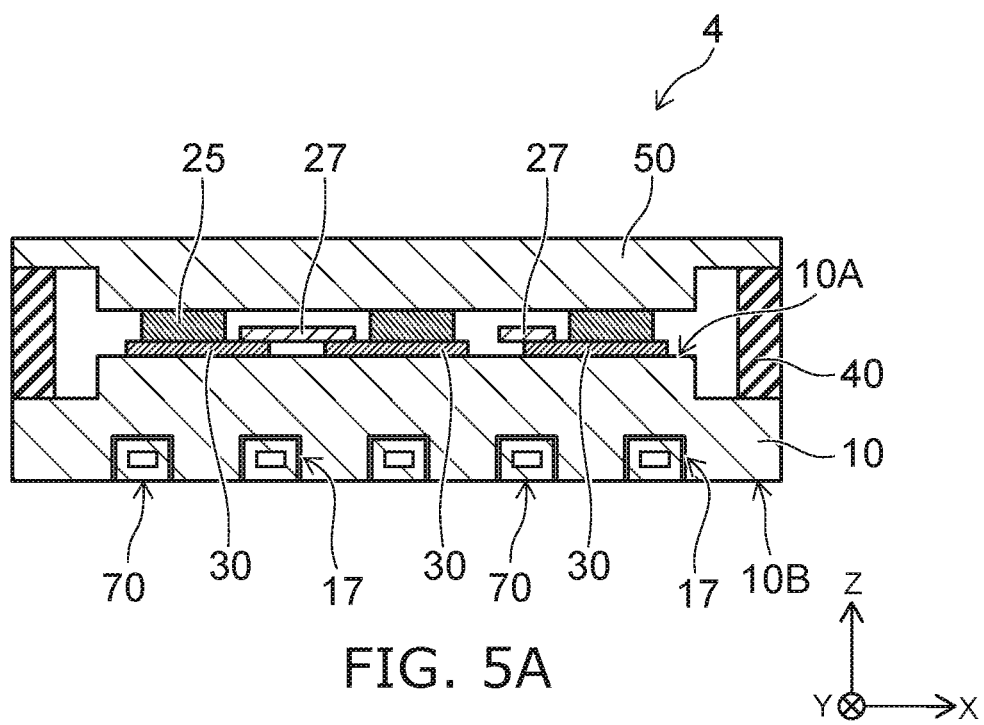
FIGS. 5A and 5B are schematic views showing a semiconductor device according to a modification of the embodiment.
Figure 5B:
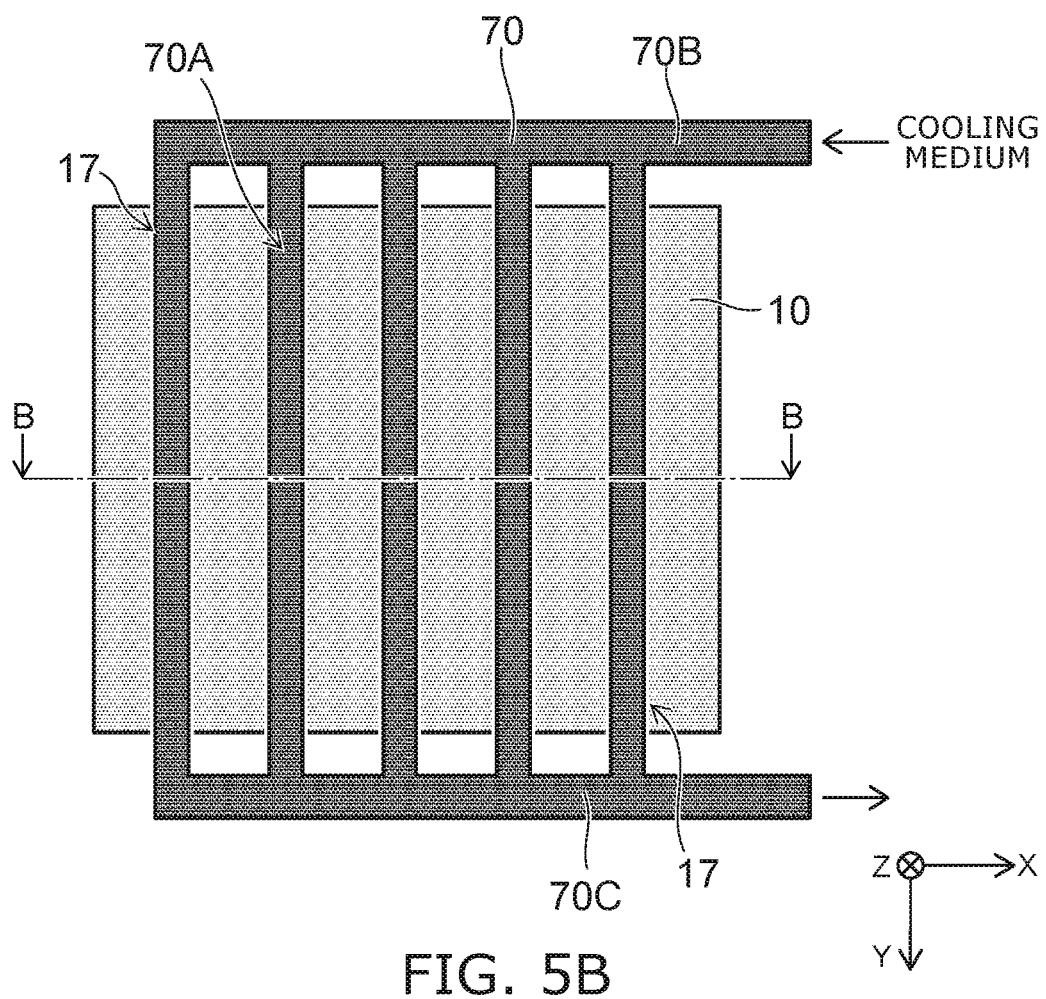

FIGS. 5A and 5B are schematic views showing a semiconductor device 4 according to a modification of the embodiment. FIG. 5A is a schematic view showing a cross section along line B-B shown in FIG. 5B. FIG. 5B is a schematic view showing the backside of the first electrode plate 10.

As shown in FIG. 5A, the multiple semiconductor chips 30 and the gate interconnect 27 are disposed between the first electrode plate 10 and the second electrode plate 20. For example, the semiconductor chips 30 are disposed to contact the first electrode plate 10. The semiconductor chips 30 are, for example, IGBTs or MOS transistors. The gate interconnect 27 is connected to the gate electrodes 33 of the semiconductor chips 30 (referring to FIG. 3B). The metal spacer 25 is disposed between the second electrode plate 20 and the semiconductor chip 30 and ensures the space where the gate interconnect 27 is disposed.

In the example, the first electrode plate 10 has multiple grooves 17 in a back surface 10B on the side opposite to a front surface 10A contacting the semiconductor chips 30. Also, a cooling pipe 70 is disposed in the interiors of the grooves 17 when assembling the power converter 200. In other words, the grooves 17 function as a cooling space.

As shown in FIG. 5B, the multiple grooves 17 are provided in the backside of the first electrode plate 10. For example, the grooves 17 extend in the Y-direction. The cooling pipe 70 is disposed in the interiors of the multiple grooves 17. The cooling pipe 70 is, for example, a metal pipe.

The cooling pipe 70 includes, for example, multiple cooling portions 70A, an inflow portion 70B of the cooling medium, and an outflow portion 70C of the cooling medium. For example, the cooling portions 70A, the inflow portion 70B, and the outflow portion 70C are connected in a ladder-like configuration; and the cooling portions 70A are disposed in the interiors of the grooves 17.

In the example, the size of the multiple semiconductor devices 4 stacked in the Z-direction can be reduced because the cooling pipe 70 is placed in the interiors of the grooves provided in the first electrode plate 10. Also, the cooling efficiency of the semiconductor chips 30 can be increased because the first electrode plate 10 that contacts the semiconductor chips 30 is cooled via the cooling pipe 70.

The embodiments are not limited to the examples recited above; and the characteristic forms of each embodiment may be implemented in combination with each other. For example, an IGBT or a MOS transistor may be provided together with a diode between the first electrode plate 10 and the second electrode plate 20. Also, a form is possible in which the cooling space CH is replaced with the grooves 17.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode plate;
a second electrode plate disposed to oppose the first electrode plate; and
a semiconductor chip disposed between the first electrode plate and the second electrode plate, at least one of the first electrode plate and the second electrode plate having a space where a cooling medium circulates,
wherein at least one of the first electrode plate or the second electrode plate includes an inflow port and an outflow port of the cooling medium.

2. The device according to claim 1, further comprising a cooling pipe in which the cooling medium circulates, wherein
the cooling pipe is disposed inside the space in one of the first electrode plate and the second electrode plate.

3. The device according to claim 2, wherein
the one of the first electrode plate and the second electrode plate has a first surface facing the semiconductor chip, a second surface opposite to the first surface, and a groove provided in the second surface; and the cooling pipe is disposed in an interior of the groove.

4. The device according to claim 1, wherein the at least one of the first electrode plate and the second electrode plate has a first surface facing the semiconductor chip and a second surface opposite to the first surface, and the space is provided on the second surface side and extends in a direction along the second surface.

5. The device according to claim 1, wherein the first surface contacts the semiconductor chip.

6. The device according to claim 1, further comprising a metal spacer disposed between the semiconductor chip and one of the first electrode plate and the second electrode plate,
the semiconductor chip including a control electrode on a surface a part of which contacting the metal spacer.

7. The device according to claim 6, wherein the semiconductor chip is electrically connected to the one of the first electrode plate and the second electrode plate via the metal spacer.

8. The device according to claim 6, further comprising a control interconnect disposed between the first electrode plate and the second electrode plate, the control interconnect being electrically connected to the control electrode.

9. The device according to claim 1, further comprising a case surrounding the semiconductor chip, the case being provided to seal a space between the first electrode plate and the second electrode plate.

10. The device according to claim 1, wherein
the semiconductor chip is disposed in a plurality between the first electrode plate and the second electrode plate, and
the semiconductor chip is connected in parallel to the first electrode plate and the second electrode plate.

11. A power converter, comprising a plurality of semiconductor devices, the semiconductor devices each including:
a first electrode plate;
a second electrode plate disposed to oppose the first electrode plate; and
a semiconductor chip disposed between the first electrode plate and the second electrode plate,
the plurality of semiconductor devices being stacked such that the semiconductor chips are connected in series,
at least one of the semiconductor devices having a space where a cooling medium circulates, the space being provided in one of the first electrode plate and the second electrode plate.

12. The power converter according to claim 11, wherein
the plurality of semiconductor devices includes a first semiconductor device and a second semiconductor device, the second semiconductor device being disposed directly on the first semiconductor device,
the second electrode plate of the second semiconductor device is disposed on the first electrode plate of the first semiconductor device,
the second electrode plate of the second semiconductor device has a space where the cooling medium circulates, and
the first electrode plate of the first semiconductor device is configured not to have a space where the cooling medium circulates.

13. The power converter according to claim 12, wherein the second electrode plate of the second semiconductor device is directly connected to the semiconductor chip.

14. The power converter according to claim 12, further comprising a cooling pipe through which the cooling medium circulates, wherein
the second electrode plate of the second semiconductor device has a first surface facing the semiconductor chip and a second surface opposite to the first surface, and the cooling pipe is disposed in the space provided as a groove on the second surface side.

\* \* \* \* \*